United States Patent
Lee

(10) Patent No.: US 7,327,613 B2
(45) Date of Patent: Feb. 5, 2008

(54) INPUT CIRCUIT FOR A MEMORY DEVICE

(75) Inventor: Chang Hyuk Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 624 days.

(21) Appl. No.: 10/965,461

(22) Filed: Oct. 14, 2004

(65) Prior Publication Data

US 2005/0243608 A1    Nov. 3, 2005

(30) Foreign Application Priority Data

Apr. 28, 2004  (KR) .................. 10-2004-0029605

(51) Int. Cl.
*G11C 7/10* (2006.01)
(52) U.S. Cl. ............ 365/189.02; 365/191; 365/230.02; 365/233
(58) Field of Classification Search ........... 365/189.01, 365/189.02, 189.05, 191, 193, 194, 195, 365/198, 230.02, 230.03, 233.5, 238.5
See application file for complete search history.

(56) References Cited

U.S. PATENT DOCUMENTS

| | | | |
|---|---|---|---|
| 6,347,064 B1 * | 2/2002 | Seo | 365/233 |
| 6,958,935 B2 * | 10/2005 | Lee et al. | 365/185.11 |
| 7,184,325 B2 * | 2/2007 | Lee | 365/189.05 |
| 2007/0115732 A1 * | 5/2007 | Lee | 365/189.05 |

* cited by examiner

*Primary Examiner*—Anh Phung
*Assistant Examiner*—Alexander Sofocleous
(74) *Attorney, Agent, or Firm*—Ladas & Parry LLP

(57) ABSTRACT

Discussed is an input circuit for a memory device which can improve the data processing speed by controlling the operation of an input multiplexer for determining a transfer path of data having passed through a data input buffer. The input circuit separately controls the operations of the input multiplexer and data bus writers to improve the operating speed. The input multiplexer receives data outputted from data buffers and determines the transfer path of the data.

11 Claims, 5 Drawing Sheets

INPUT CIRCUIT FOR A MEMORY DEVICE

BACKGROUND OF THE INVENTION

1. Field of the Invention

The present invention relates to an input buffer for a memory device, and more particularly to an input circuit for a memory device which can improve the data processing speed by controlling the operation of an input multiplexer for determining a transfer path of data having passed through a data input buffer.

2. Description of the Prior Art

The processing speed of a semiconductor memory device becomes faster and faster. In addition, with the development of DDR SDRAM that can access two data with one clock, the processing speed of the memory device becomes much faster. The process of input data of the memory device is one of important issues in improving the processing speed of the memory device.

FIG. 1 illustrates a conventional data input circuit of a memory device. For reference, the memory device mentioned in the description refers to a DDR SDRAM and a DDR2 SDRAM that is the next-generation memory device.

As shown in FIG. 1, the conventional data input circuit of a memory device includes data buffers 101 and 102, an input multiplexer 103, data bus writers 105 and 106, block writers 107 and 108, and an input selection signal generating unit 194 for controlling the operation of the data bus writers 105 and 106.

For convenience in explanation, FIG. 1 illustrates only two data buffers 101 and 102, but the number of data buffers is 16 if the data input/output structure of the memory device is X16. Accordingly, it can be recognized that 14 buffers further exist in addition to the two data buffers 101 and 102 illustrated in FIG. 1.

The basic operation of the conventional data input circuit will now be explained.

The data buffers 101 and 102 controlled by a control signal Din clk receives corresponding data D0 and D1 and output data D0_1 and D1_1. Here, the control signal Din clk is a signal (or a clock) generated as many as BL/2 times, and indicates a signal generated in synchronization with a rising edge of the first data strobe signal (hereinafter referred to as a "DQS signal").

The input multiplexer 103 is a constituent element that determines transfer paths of the data D0_1 and D1_1. Here, the reason why the transfer paths of the data are determined is that the memory device having a data input/output structure of X16 may use a data input/output structure of X8 as needed.

For example, it is assumed that if the data pins of the memory device are set to X16, 16-bit data is applied. In this case, the data D0_1 is transferred to the data bus writer 105 along a solid line as indicated in FIG. 1, and the data D1_1 is transferred to the data bus writer 106 along a solid line as indicated in FIG. 1. The remaining data D2_1, ..., D15_1 are transferred in the same manner.

Also, it is assumed that 8-bit data is applied in a state that the data pins of the memory device are set to X16. In this case, the remaining 8 buffers except for the 8 buffers being used become unnecessary.

Meanwhile, it should be determined which data bus writer between the two data bus writers 105 and 106 the data having passed through the data buffers 101 and 102 is transferred to by the input multiplexer 103. For example, the data D0_1 having passed through the data buffer 101 is transferred to one of the two data bus writers 105 and 106 by the input multiplexer 103. The input multiplexer 103 serves to determine the data transfer path if the data composed of bits smaller than the prescribed bits is applied.

The data bus writers 105 and 106 transfer the data from the input multiplexer 103 to a global input lines gio0 and gio1. In the case that the memory device having the data input/output structure of X16 operates, the data bus writers transfer the data from the input multiplexer to the global input/output lines as they are. By contrast, in the case that the memory device having the data input/output structure of X8 operates, the output terminals of the data bus writer to which no data is inputted are kept in an initial state or in a pre-charge state.

The block writers 107 and 108 transfer the data to a memory block (not illustrated) through local input lines lio0 and lio1. Here, the memory block means a partitioned area in a memory bank (i.e., a memory bank is composed of a plurality of memory blocks).

The input selection signal generating unit 104 receives a 2-clock-shifted block column address and a control signal clk Din and outputs a signal for controlling the operation of the data bus writers 105 and 106. Here, the 2-clock-shifted block column address, as shown in FIG. 2, is a signal that is 2-clock-delayed in comparison to a column address inputted by a write command, and is for selecting a specified block of the memory bank. The control signal clk Din is a clock signal generated as many as BL/2 times after being 2-clock-delayed after the write command. That is, as shown in FIG. 2, the control signal clk Din is a clock signal generated in synchronization with the rising edge of the clock at a time point t3.

FIG. 2 is a waveform diagram illustrating waveforms appearing at various point of the circuit of FIG. 1.

In FIG. 2, the term "clk" denotes a clock signal applied to the memory device and the control signal Din clk is a signal for controlling the data buffers 101 and 102. The data D0_2 indicates data outputted from the input multiplexer 103. The control signal clk Din is a clock signal generated after being 2-clock-delayed after the write command. The 2-clock-shifted block column address is 2-clock-delayed in comparison to the column address inputted in synchronization with the same clock as the write command input.

In operation, the input selection signal generating unit 104 enables the data bus writers 105 and 106 if both the 2-clock-shifted block column address and the control signal clk Din are in a high level.

However, according to the conventional data input circuit, the control signal is generated when a predetermined time elapses after the 2-clock-shifted block column address is generated, and this causes the driving time of the data bus writers to be delayed as much as the predetermined time. This finally causes the data transfer speed to deteriorate.

SUMMARY OF THE INVENTION

Accordingly, the present invention has been made to solve the above-mentioned problems occurring in the prior art, and an object of the present invention is to provide an input circuit for a memory device which can improve the data processing speed by making the data bus writers operate early.

Another object of the present invention is to provide an input circuit for a memory device which implements the function of a conventional input selection signal generating unit by using an input multiplexer.

Still another object of the present invention is to provide an input circuit for a memory device which can improve the data processing speed through one-clock shifting of a block column address inputted during a write command operation.

In order to accomplish these objects, there is provided an input circuit for a memory device, comprising 2N data buffers for receiving data applied from an outside, N input multiplexers and 2N data bus writers, wherein a pair of data buffers among the 2N data buffers are connected to one of the N input multiplexers, respectively, the respective input multiplexer is connected to a pair of data bus writers among the 2N data bus writers, and a certain pair of the i-th and (i+1)-th data buffers among the 2N data buffers correspond to the k-th input multiplexer and the k-th input multiplexer corresponds to the i-th and (i+1)-th data bus writers, and wherein (a) if first data and second data are outputted from the i-th and (i+1)-th data buffers, the k-th input multiplexer transfers the first data to the i-th data bus writer, and the second data to the (i+1)-th data bus writer, and (b) if a third data is outputted from only one of the i-th and (i+1)-th data buffers, the k-th input multiplexer selectively transfers the third data to one of the i-th and (i+1)-th data bus writers, and the k-th input multiplexer operates so that a transfer path of the third data is determined by a one-clock-delayed block column address in comparison to a column address inputted by a write command.

In the present invention, in the case of a DDR SDRAM, data is applied one by one in synchronization with rising and falling edges of a DQAS signal. Accordingly, the 2N buffers may be buffers that receive the data synchronized with the rising edge of the DQS signal or buffers that receive the data synchronized with the falling edge of the DQS signal.

In another aspect of the present invention, there is provided an input circuit for a memory device, comprising a plurality of data buffers for receiving data applied from an outside; an input multiplexer including a block column address input unit for inputting a block column address that is one-clock-delayed in comparison to a column address, a first switch/latch means, connected to an output path of the first data buffer, for storing and outputting output data of the first data buffer, a second switch/latch means, connected to an output path of the second data buffer, for storing and outputting output data of the second data buffer, and a switch means for connecting the output data of the first data buffer to the output path of the second data buffer; a first data bus writer connected to a first output terminal of the input multiplexer; and a second data bus writer connected to a second output terminal of the input multiplexer.

Preferably, the data buffers operate in response to an input of a control signal generated in synchronization with a DQS signal.

Preferably, the block column address input unit comprises a first decoding unit for receiving the block column address and a first input selection signal and controlling the first switch/latch means, and a second decoding unit for receiving the block column address and the first input selection signal and controlling the second switch/latch means.

Preferably, the switch means operates in response to an input of a second input selection signal.

Preferably, the first input selection signal is a signal generated if a data input/output structure is of X16, and the second input selection signal is a signal generated if the data input/output structure is of X8.

Preferably, the first data bus writer outputs data to a first global input line.

Preferably, the second data bus writer outputs data to a second global input line.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
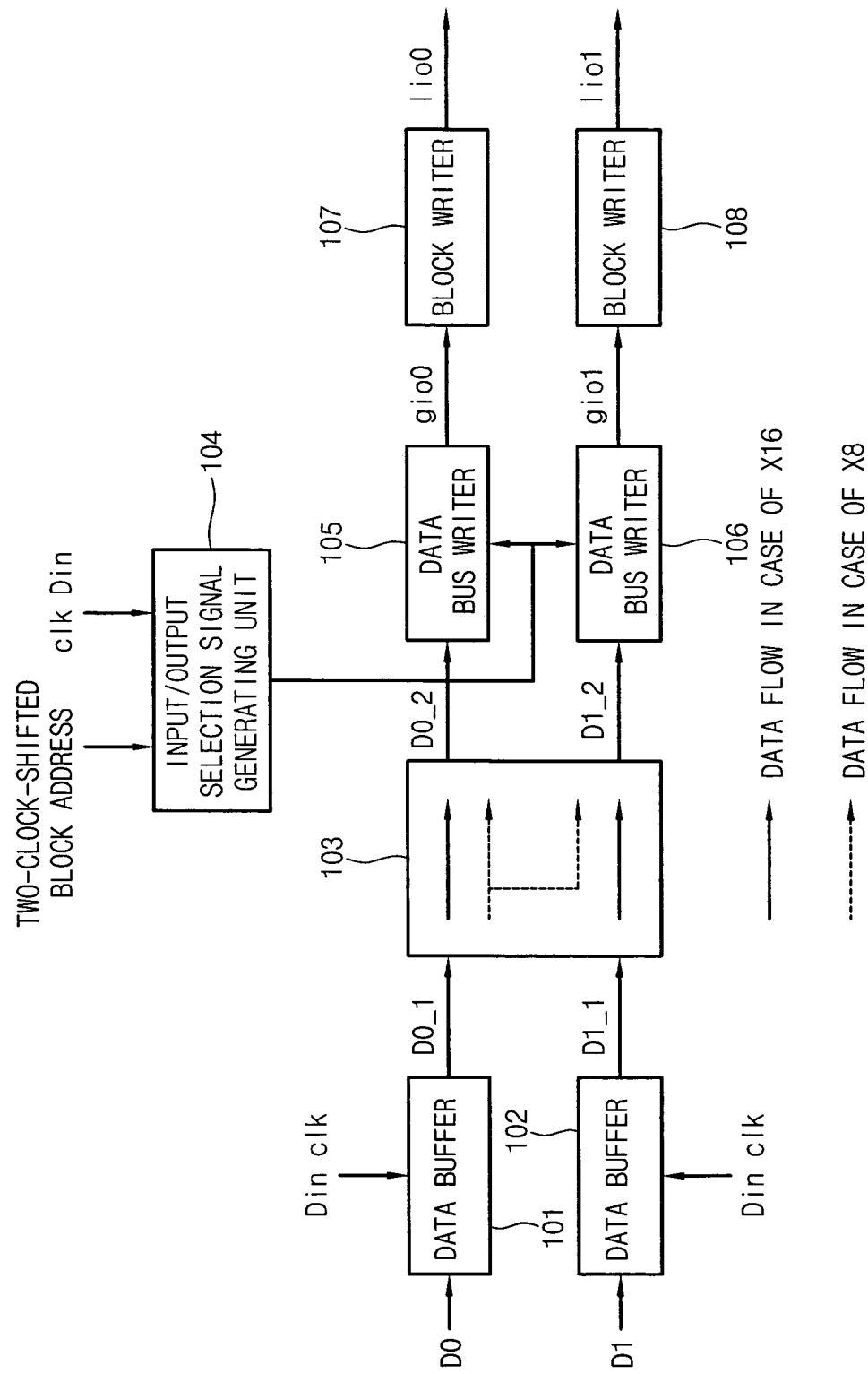
FIG. 1 is a block diagram illustrating the construction of a conventional data input circuit of a memory device.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 3:
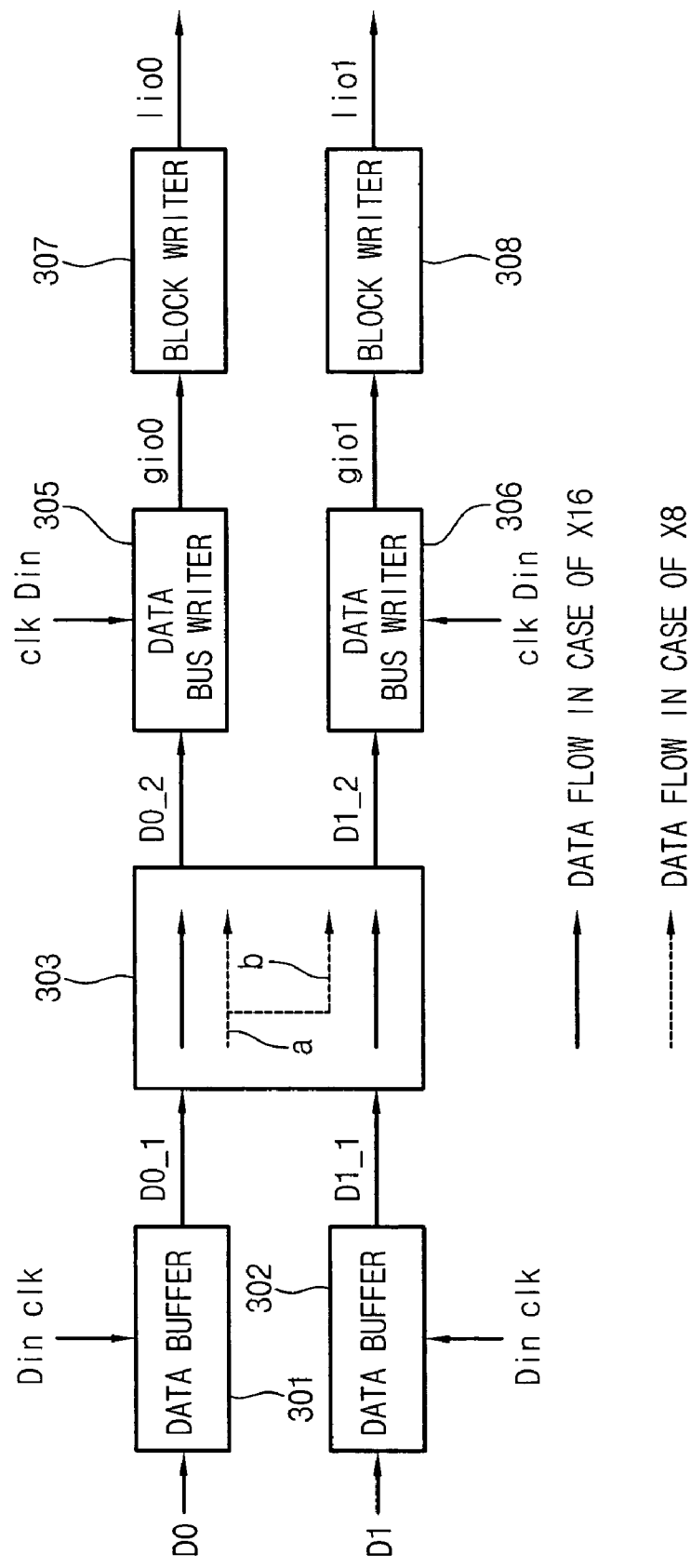
FIG. 3 is a block diagram illustrating the construction of a data input circuit according to the present invention.

FIG. 3 is a block diagram illustrating the construction of a data input circuit according to the present invention. Hereinafter, explanation will be made based on a memory device of X16, i.e., having 16 memory buffers.

The data input circuit according to the present invention includes data buffers 301 and 302, an input multiplexer 303, data bus writers 305 and 306 and block writers 307 and 308. For convenience in explanation, FIG. 3 illustrates only two data buffers 301 and 302, but the number of data buffers is 16, i.e., X16. Accordingly, it can be recognized that 14 buffers further exist in addition to the two data buffers 301 and 302 illustrated in FIG. 3. The basic construction of the data buffers not illustrated are the same as that of the data buffers as illustrated in FIG. 3.

Also, the basic construction of the data buffers 301 and 302 of FIG. 3 and the block writers 307 and 308 are actually the same as that of the data buffers 101 and 102 of FIG. 1 and the block writers 107 and 108.

The operation of the data input circuit of FIG. 3 will now be explained.

In the case of the data input/output structure of X16, data applied to the respective data buffers are applied to the data bus writers along solid lines of the input multiplexer 303 and then applied to the block writers by the control signal clk Din. Accordingly, the basic transfer path of data is the same as that of FIG. 1.

Then, in the case of the data input/output structure of X8, it is assumed that data is applied to the data buffer 301 but no data is applied to the data buffer 302.

First Case: The data D0_1 outputted from the data buffer 301 can be applied to the data bus writer 305 through a path a by the input multiplexer 303. In this case, the data D1_2 of the output terminal to which no data is transferred is kept in the previous state.

Second Case: The data D0_1 outputted from the data buffer 301 can be applied to the data bus writer 306 through a path b by the input multiplexer 303. In this case, the data D0_2 of the output terminal to which no data is transferred is kept in the previous state.

The data bus writers 305 and 306 receive the data D0_2 and D1_2, respectively, and their operations are controlled by the control signal clk Din. After the write command, the control signal clk Din is generated in synchronization with a clock signal after two clocks.

Figure 4:
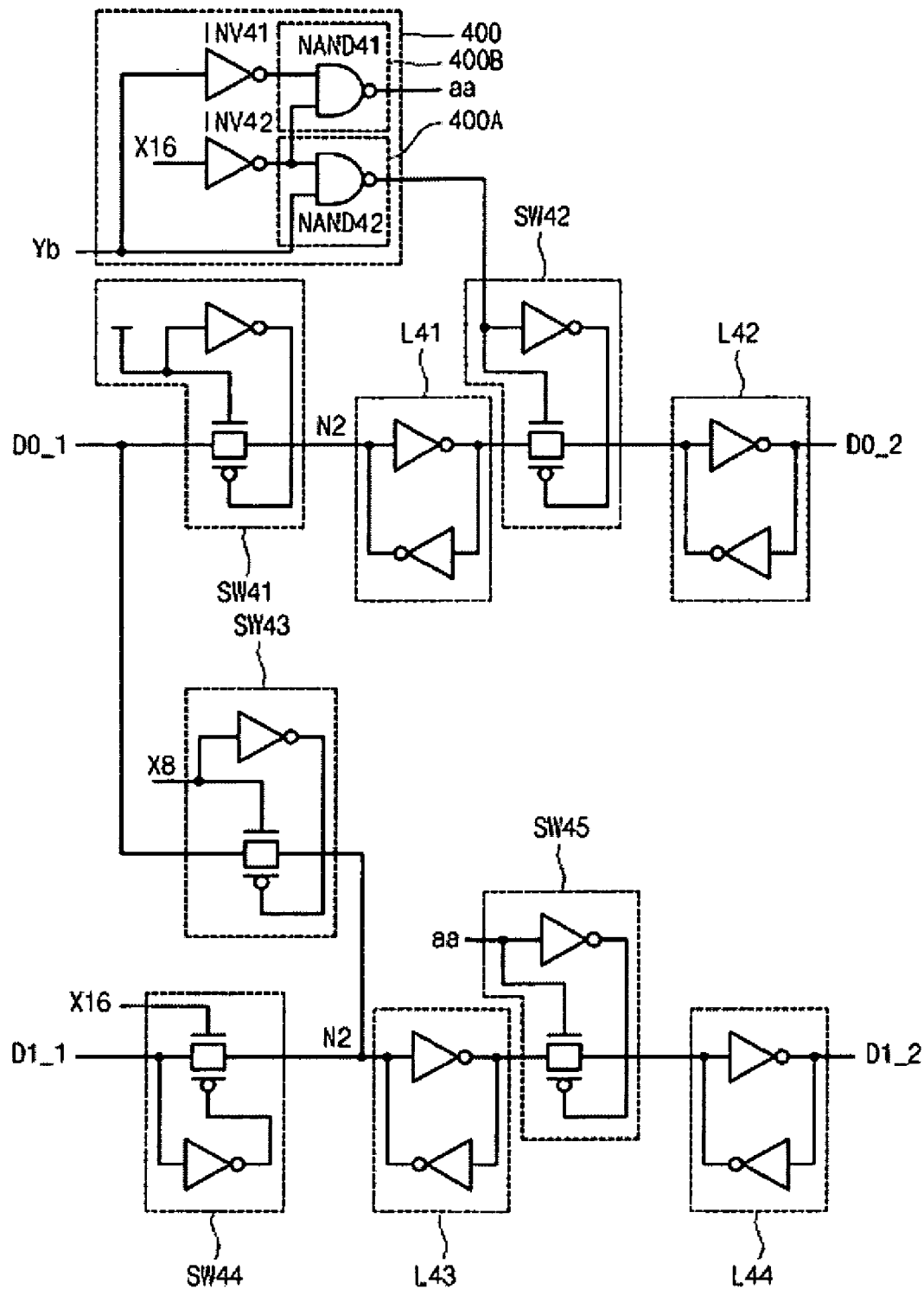
FIG. 4 is a circuit diagram illustrating the construction of an input multiplexer of FIG. 3.

FIG. 4 is a circuit diagram illustrating the construction of an input multiplexer of FIG. 3.

As shown in FIG. 4, the multiplexer according to the present invention includes a block column address input unit 400 for inputting a block column address Yb that is one-clock-delayed in comparison to a column address and a first input selection signal X16, a first switch/latch means SW41, L41, SW42 and L42, connected to an output path of the first data buffer 301, for storing and outputting output data D0_1 of the first data buffer 301, a second switch/latch means SW44, L43, SW45 and L44, connected to an output path of the second data buffer 302, for storing and outputting output data D1_1 of the second data buffer 302, and a switch means SW43 for connecting the output of the first data buffer 301 to the output path of the second data buffer 302.

Referring to FIG. 4, the input multiplexer is provided with a plurality of switches SW41, SW42, SW43, SW44 and SW45 and latches L41, L42, L43 and L44. In FIG. 4, the first input selection signal X16 indicates a high level if the input data is of 16 bits, and the second input selection signal X8 indicates a high level if the input data is of 8 bits. The control signal Yb indicates a one-clock-shifted block column address. Here, the one-clock-shifted block column address Yb is a signal that is one-clock-delayed in comparison to the column address inputted by a write command and that is for selecting a specified block of the memory bank.

Specifically, the input multiplexer of FIG. 4 includes a first inverter INV42 for receiving the first input selection signal X16, a second inverter INV41 for receiving the control signal Yb, a first NAND gate NAND42 for receiving an output signal of the first inverter INV42 and the control signal Yb, a second NAND gate NAND41 for receiving the output signal of the first inverter INV42 and an output signal of the second inverter INV41, the first switch SW41 for connecting the output terminal of the data buffer 301 to the first latch L41, the second switch SW42 for being controlled by an output signal of the first NAND gate NAND42 and connecting the first latch L41 to the second latch L42, the third switch SW43 for being controlled by the second input selection signal X8 and connecting the output terminal of the data buffer 301 to a first node N3, the fourth switch SW44 for being controlled by the first input selection signal and connecting the output terminal of the data buffer 302 to the first node, the third latch L43 for latching data of the first node, and the fifth switch SW45 for being controlled by an output signal of the second NAND gate and connecting the third latch L43 to the fourth latch L44.

In FIG. 4, the first switch is always in a turned-on state, and the control signal is the block column address Yb.

In the case of the data input/output structure of X16, the first input selection signal is in a high level, the second input selection signal is in a low level, and data is inputted to either of the data buffers 301 and 302.

Now, the operation of the input multiplexer as constructed above will be explained in detail.

First, if the first input selection signal X16 is in a high level (in this case, the second input selection signal X8 is in a low level), the output of the NAND gate NAND42 is in a high level irrespective of the control signal Yb, and thus the switch SW42 is turned on. Also, a node aa is in a high level, and thus the switch SW45 is turned on.

Consequently, data D0_1 is transferred to the output terminal D0_2 through the switch SW41, the latch L41, the switch SW42 and the latch L42.

Second, if the second input selection signal X8 is in a high level (in this case, the first input selection signal X16 is in a low level), the transfer path of the data is determined according to the logic level of the control signal Yb.

If the control signal Yb is in a high level, the switch SW42 is turned off. In this case, the node aa is in a high level, and thus the switch SW45 is turned on. Accordingly, the data D0_1 is transferred to the output terminal D1_2 through the switch SW43, the latch L43, the switch SW45 and the latch L44. Meanwhile, the output terminal D0_2 is kept in the previous state. That is, the output terminal maintains the data stored in the latch L42.

If the control signal Yb is in a low level, the switch SW42 is turned on. In this case, since the node aa is in a low level, the switch SW45 is turned off. Accordingly, the data D0_1 is transferred to the output terminal D0_2 through the switch SW41, the latch L41, the switch SW42 and the latch L42. The output terminal D1_2 is kept in the previous state. That is, the output terminal maintains the data stored in the latch L44.

Figure 5:
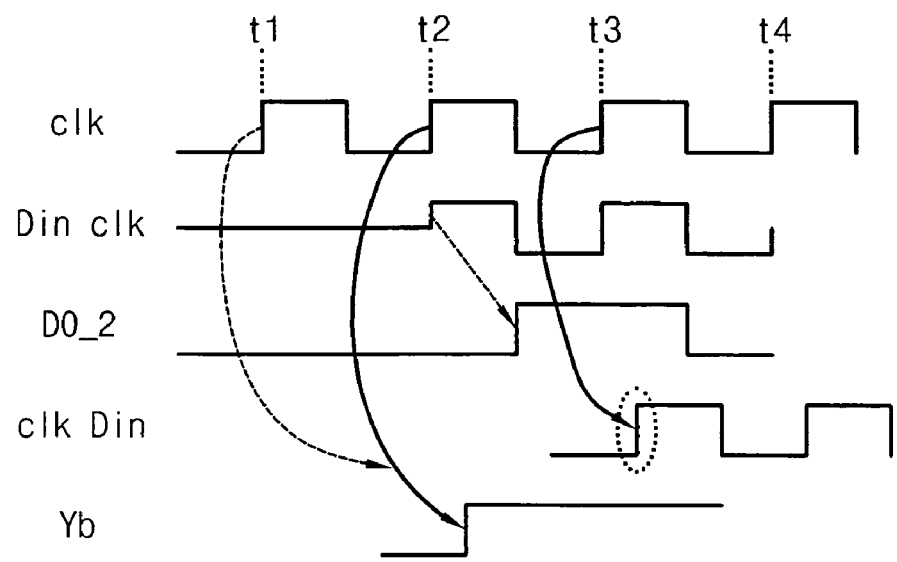
FIG. 5 is a waveform diagram illustrating waveforms appearing at various points of the circuits of FIGS. 3 and 4.

FIG. 5 is a waveform diagram illustrating waveforms appearing at various points of the circuits of FIGS. 3 and 4.

As shown in FIGS. 3, 4 and 5, in the case of X8, the input multiplexer transfers the data using the one-clock-shifted block column address Yb, and the data bus writer transfer the data D0_2 and D1_2 to the global lines gio0 and gio1 by the cotnrlo signal clk Din.

Figure 2:
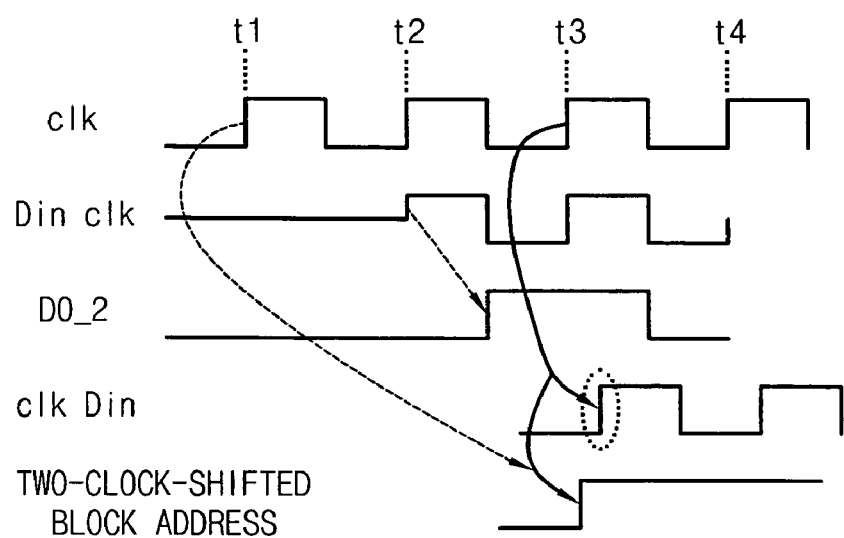
FIG. 2 is a waveform diagram illustrating waveforms appearing at various points of the circuit of FIG. 1.

As described above, according to the conventional input circuit as shown in FIGS. 1 and 2, a specified margin of time is required until the control signal clk Din is generated after the two-clock-shifted block column address is generated.

According to the present invention, however, by implementing the multiplexer that receives the one-clock-shifted block column address and performs a multiplexing according to the received one-clock-shifted block column address, the time point for generating the control signal clk Din for controlling the data bus writer can be set to be earlier than that according to the conventional input circuit. In other words, it is not required to generate the control signal after a predetermined time from the one-clock-shifted block column address. This is because the input path selection function (in the case of X8, the data transfer path determining function according to the logic level of the control signal Yb) and the function of the control signal clk Din are independently performed.

In the embodiment of the present invention, the data input/output structures of X8 and X16 are explained, but it will be apparent that the present invention can be applied to diverse data input/output structures of X4, X8, X16, X32, etc.

As described above, the present invention can achieve the high-speed data process by providing a multiplexer having an improved construction. In particular, in the case of X8, the write timing can be improved. Also, the present invention makes it possible to design the shortest path for the control signal clk Din.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. An input circuit for a memory device, comprising:
   2N data buffers for receiving data applied from an outside;
   N input multiplexers; and
   2N data bus writers;

wherein a pair of data buffers among the 2N data buffers are connected to one of the N input multiplexers, respectively;

the respective input multiplexer is connected to a pair of data bus writers among the 2N data bus writers; and a certain pair of the i-th and (i+1)-th data buffers among the 2N data buffers correspond to the k-th input multiplexer and the k-th input multiplexer corresponds to the i-th and (i+1)-th data bus writers; and wherein (a) if first data and second data are outputted from the i-th and (i+1)-th data buffers, the k-th input multiplexer transfers the first data to the i-th data bus writer, and the second data to the (i+1)-th data bus writer; and (b) if a third data is outputted from only one of the i-th and (i+1)-th data buffers, the k-th input multiplexer selectively transfers the third data to one of the i-th and (i+1)-th data bus writers, and the k-th input multiplexer operates so that a transfer path of the third data is determined by a one-clock-delayed block column address in comparison to a column address inputted by a write command.

2. The input circuit as claimed in claim 1, wherein in the case of (b), output terminals of the input multiplexer from which the third data is not transferred are kept in the previous states.

3. The input circuit as claimed in claim 1, wherein the operation of the data bus writer is controlled by a control signal generated in synchronization with a clock signal after two clocks after the write command is outputted.

4. The input circuit as claimed in claim 1, wherein the k-th input multiplexer comprises:

a first inverter for receiving a first input selection signal X16;

a second inverter for receiving a control signal Yb;

a first NAND gate for receiving an output signal of the first inverter and the control signal Yb;

a second NAND gate for receiving the output signal of the first inverter and an output signal of the second inverter;

a first switch for connecting an output terminal of the i-th data buffer to a first latch;

a second switch for being controlled by an output signal of the first NAND gate and connecting the first latch to a second latch;

a third switch for being controlled by a second input selection signal X8 and connecting an output terminal of the i-th data buffer to a first node;

a fourth switch for being controlled by the first input selection signal and connecting an output terminal of the (i+1)-th data buffer to the first node;

a third latch for latching data of the first node; and a fifth switch for being controlled by an output signal of the second NAND gate and connecting the third latch to a fourth latch;

wherein the first switch is always in a turned-on state;

the control signal is the block column address;

in the case that the data is inputted to the i-th and (i+1)-th data buffers, the first input selection signal is enabled to a high level and the second input selection signal is disabled to a low level; and in the case that the data is inputted to either of the i-th and (i+1)-th data buffers, the first input selection signal is disabled to a low level, the second input selection signal is enabled to a high level, and the data transfer path is determined according to a logic level of the control signal.

5. An input circuit for a memory device, comprising:

a plurality of data buffers for receiving data applied from an outside;

an input multiplexer including a block column address input unit for inputting a block column address that is one-clock-delayed in comparison to a column address, a first switch/latch means, connected to an output path of the first data buffer, for storing and outputting output data of the first data buffer, a second switch/latch means, connected to an output path of the second data buffer, for storing and outputting output data of the second data buffer, and a switch means for connecting the output data of the first data buffer to the output path of the second data buffer;

a first data bus writer connected to a first output terminal of the input multiplexer; and a second data bus writer connected to a second output terminal of the input multiplexer.

6. The input circuit as claimed in claim 5, wherein the data buffers operate in response to an input of a control signal generated in synchronization with a DQS signal.

7. The input circuit as claimed in claim 5, wherein the block column address input unit comprises:

a first decoding unit for receiving the block column address and a first input selection signal and controlling the first switch/latch means; and a second decoding unit for receiving the block column address and the first input selection signal and controlling the second switch/latch means.

8. The input circuit as claimed in claim 5, wherein the switch means operates in response to an input of a second input selection signal.

9. The input circuit as claimed in claim 8, wherein the first input selection signal is a signal generated if a data input/output structure is of X16, and the second input selection signal is a signal generated if the data input/output structure is of X8.

10. The input circuit as claimed in claim 5, wherein the first data bus writer outputs data to a first global input line.

11. The input circuit as claimed in claim 5, wherein the second data bus writer outputs data to a second global input line.

* * * * *